United States Patent
Yu

(10) Patent No.: US 7,683,816 B2
(45) Date of Patent: Mar. 23, 2010

(54) SYSTEM FOR DISPLAYING IMAGES

(75) Inventor: Cheng-Ho Yu, Yuanlin Township (TW)

(73) Assignee: TPO Displays Corp., Chu-Nan (TW)

( * ) Notice: Subject to any disclaimer, the term of this patent is extended or adjusted under 35 U.S.C. 154(b) by 14 days.

(21) Appl. No.: 12/229,360

(22) Filed: Aug. 21, 2008

(65) Prior Publication Data
US 2009/0073015 A1    Mar. 19, 2009

(30) Foreign Application Priority Data
Sep. 13, 2007    (TW) .............................. 96134229 A

(51) Int. Cl.
*H03M 1/66* (2006.01)

(52) U.S. Cl. .................... 341/150; 341/144; 345/87; 345/91; 345/103; 345/104

(58) Field of Classification Search ............... 341/144, 341/150; 345/87, 90, 91, 103, 104
See application file for complete search history.

(56) References Cited

U.S. PATENT DOCUMENTS

| | | | | |
|---|---|---|---|---|
| 6,169,508 | B1* | 1/2001 | Edwards ................... | 341/150 |
| 6,181,314 | B1* | 1/2001 | Nakajima et al. ........... | 345/100 |
| 6,486,812 | B1* | 11/2002 | Tanaka ..................... | 341/144 |
| 6,549,196 | B1* | 4/2003 | Taguchi et al. ............. | 345/210 |
| 6,801,186 | B2* | 10/2004 | Han et al. .................. | 345/103 |
| 7,355,581 | B2* | 4/2008 | Kim .......................... | 345/98 |
| 7,436,385 | B2* | 10/2008 | Kim et al. .................. | 345/98 |
| 7,515,132 | B2* | 4/2009 | Kim et al. .................. | 345/98 |
| 7,535,467 | B2* | 5/2009 | Kim et al. .................. | 345/204 |
| 7,592,940 | B2* | 9/2009 | Sung ......................... | 341/145 |
| 2004/0183772 | A1* | 9/2004 | Nakajima et al. .......... | 345/102 |
| 2005/0001799 | A1* | 1/2005 | Kim .......................... | 345/87 |
| 2008/0297390 | A1* | 12/2008 | Ko et al. .................... | 341/144 |

OTHER PUBLICATIONS

Tai, et al., "A Source-Follower Type Analog Buffer Using Poly-Si TFTs With Large Design Windows", IEEE Electron Device Letters, vol. 26, No. 11, Nov. 2005, pp. 811-813.
Lee, et al., "High Performance, Low-Power Integrated 8-bit Digital Data Driver for Poly-Si TFT-LCD's", 1999 SID, pp. 1-4.

* cited by examiner

*Primary Examiner*—Linh V Nguyen
(74) *Attorney, Agent, or Firm*—Liu & Liu

(57) ABSTRACT

A system for displaying images is provided. A capacitor type digital-to-analog converter is coupled between a first node and a second node and generates a first analog signal according to a digital signal with N bit data. An analogue buffer is coupled between the second node and a third node and generates a second analog signal according to the first analog signal and a bias voltage. A first switch is coupled between a predetermined voltage and the second node. A second switch is coupled between the first node and the third node. A third switch is coupled between the third node and an analog output signal. The second switch is turned on and the third switch is turned off when the first switch is turned on, and the first and second switches are turned off when the third switch is turned on.

17 Claims, 7 Drawing Sheets

SYSTEM FOR DISPLAYING IMAGES

CROSS REFERENCE TO RELATED APPLICATIONS

This Application claims priority of Taiwan Patent Application No. 096134229, filed on Sep. 13, 2007, the entirety of which is incorporated by reference herein.

BACKGROUND OF THE INVENTION

1. Field of the Invention

The invention relates to a digital-to-analog converting circuit, and more particularly to a digital-to-analog converting circuit with an analogue buffer and a capacitor type digital-to-analog converter.

2. Description of the Related Art

In image displaying systems, such as thin film transistor liquid crystal displays (TFT-LCD) fabricated by low temperature poly-Si (LTPS) technology, the bit number of a digital signal is increased due to higher resolution and gray scale. However, for application of the digital signal with higher bits, using a resistor type digital-to-analog converting circuit will greatly expand the circuit layout area. Therefore, one solution is to use the resistor type digital-to-analog converting circuit together with a capacitor type digital-to-analog converting circuit. For example, a 10-bit resistor type digital-to-analog converting circuit is re-designed to a 5-bit resistor type digital-to-analog converting circuit with a 5-bit capacitor type digital-to-analog converting circuit, or a 3-bit resistor type digital-to-analog converting circuit with a 7-bit capacitor type digital-to-analog converting circuit, thus reducing layout area.

FIG. 1 shows a conventional capacitor type digital-to-analog converting circuit 100 with an analogue buffer. The digital-to-analog converting circuit 100 comprises a capacitor type digital-to-analog converter 110 and a source follow type analogue buffer 120. The source follow type analogue buffer 120 has an active load 122 and a storage capacitor 124, which is used to compensate for an output voltage. The source follow type analogue buffer 120 can decrease the charge time and variations caused by device characteristics, and increase the input voltage range. However, during a compensation period of the source follow type analogue buffer 120, a capacitor 112, which is an equivalent capacitor of all the capacitors within the capacitor type digital-to-analog converter 110, is coupled to the storage capacitor 124. Due to the coupling, the capacitor 112 influences the voltage distribution within the storage capacitor 124, such that an incorrect voltage is stored in the storage capacitor 124, thus causing distortion of the output voltage.

BRIEF SUMMARY OF THE INVENTION

A system for displaying images is provided. An exemplary embodiment of such a system comprises a digital-to-analog converting circuit for converting a digital signal with N bit data to an analog output signal. The digital-to-analog converting circuit comprises a capacitor type digital-to-analog converter, an analogue buffer, a first switch, a second switch and a third switch. The capacitor type digital-to-analog converter is coupled between a first node and a second node, and comprises a plurality of capacitors and switches, and generates a first analog signal according to the digital signal, a first reference voltage and a second reference voltage. The analogue buffer is coupled between the second node and a third node, and generates a second analog signal according to the first analog signal and a bias voltage. The analogue buffer comprises a first transistor coupled between a predetermined voltage and the third node having a first gate coupled to the second node, and a second transistor coupled between a ground and the third node having a second gate coupled to the bias voltage. The first switch is coupled between the predetermined voltage and the second node. The second switch is coupled between the first node and the third node. The third switch is coupled between the third node and the analog output signal, and transmits the second analog signal as the analog output signal when the third switch is turned on. The second switch is turned on and the third switch is turned off when the first switch is turned on, and the first and second switches are turned off when the third switch is turned on.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
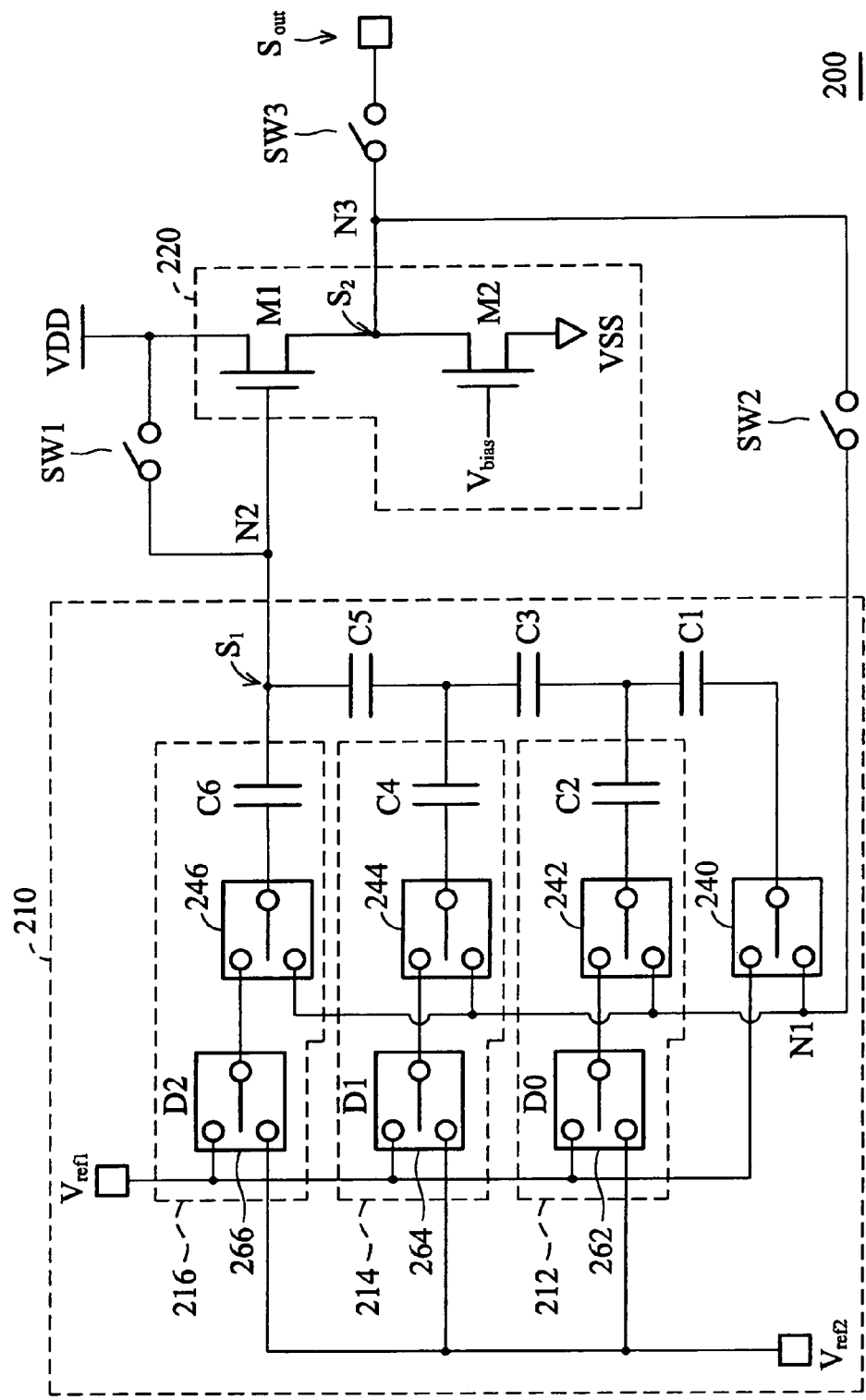
FIG. 2 shows a 3-bit digital-to-analog converting circuit according to an embodiment of the invention.

FIG. 2 shows a 3-bit digital-to-analog converting circuit 200 according to an embodiment of the invention. A 3-bit signal is consisted of the bit signals D2, D1 and D0, wherein the bit signal D2 is a most significant bit (MSB) and the bit signal D0 is a least significant bit (LSB). The digital-to-analog converting circuit 200 comprises a capacitor type digital-to-analog converter 210, an analogue buffer 220 and three switches SW1, SW2 and SW3. The capacitor type digital-to-analog converter 210 is coupled between the nodes N1 and N2 and is used to convert the 3-bit signal to an analog signal $S_1$, wherein a reference voltage $V_{ref1}$ is greater than a reference voltage $V_{ref2}$ and a voltage of the analog signal $S_1$ is between the reference voltages $V_{ref1}$ and $V_{ref2}$. The analogue buffer 220 is coupled between the nodes N2 and N3 and is used to generate an analog signal $S_2$ according to the analog signal $S_1$ and a bias signal $V_{bias}$. The analogue buffer 220 comprises two transistors M1 and M2. The transistor M1 is coupled between a supply voltage VDD and the node N3, wherein a gate of the transistor M1 is coupled to the node N2 and receives the analog signal $S_1$. The transistor M2 is coupled between a ground voltage VSS and the node N3, wherein a gate of the transistor M2 is coupled to the bias signal $V_{bias}$. In addition, the switch SW1 is coupled between the supply voltage VDD and the node N2. The switch SW2 is coupled between the nodes N1 and N3, and switch SW3 is coupled between the node N3 and an output of the digital-to-analog converting circuit 200. An enable signal $S_{enable}$ is used to switch the switches SW2 and SW3, wherein the switches SW2 and SW3 will not be turned on simultaneously. It is to be noted that the switch SW2 is turned on and the switch SW3 is turned off when the switch SW1 is turned on, and the switches SW1 and SW2 are turned off when the switch SW3 is turned on.

The capacitor type digital-to-analog converter 210 comprises three input circuits 212, 214 and 216, a mode switch 240 and a capacitor C1, wherein the input circuits 212, 214 and 216 correspond to the bit signals D0, D1 and D2, respectively. Each input circuit comprises a bit switch, a mode switch and a capacitor. For example, the input circuit 216 comprises a bit switch 266, a mode switch 246 and a capacitor C6, and the input circuit 212 comprises a bit switch 262, a mode switch 242 and a capacitor C2. Furthermore, the mode switch 240 is selectively coupled to the reference voltage $V_{ref1}$ or the node N1 according to a reset signal $S_{reset}$. The mode switch 240 is coupled to the node N1 when the reset signal $S_{reset}$ is at a high logic level. On the contrary, the mode switch 240 is coupled to the reference voltage $V_{ref1}$ when the reset signal $S_{reset}$ is at a low logic level. The capacitor type digital-to-analog converter 210 further comprises a capacitor C3 coupled between the input circuits 212 and 214 and a capacitor C5 coupled between the input circuits 214 and 216, wherein the capacitors C3 and C5 are equal in capacitance. In this embodiment, the input circuits 212, 214 and 216 and capacitors C3 and C5 form a capacitor switch network. Moreover, the capacitors C2, C4 and C6 are equal in capacitance. A capacitance ratio of the capacitors C1 to C2 is 1:1, and a capacitance ratio of the capacitors C1 to C3 is 1:2. Therefore, the capacitor type digital-to-analog converter 210 may be a C-2C ladder digital-to-analog converter.

Selecting the input circuit 216 as an exemplary example, in the input circuit 216, the bit switch 266 is selectively coupled to the reference voltages $V_{ref1}$ or $V_{ref2}$ according to a bit data of the bit signal D2. The bit switch 266 is coupled to the reference voltage $V_{ref1}$ when the bit data of the bit signal D2 is at a high logic level. On the contrary, the bit switch 266 is coupled to the reference voltage $V_{ref2}$ when the bit data of the bit signal D2 is at a low logic level. The mode switch 246 is selectively coupled to the bit switch 266 or the node N1 according to the reset signal $S_{reset}$. The mode switch 246 is coupled to the node N1 when the reset signal $S_{reset}$ is at a high logic level. On the other hand, the mode switch 246 is coupled to the bit switch 266 when the reset signal $S_{reset}$ is at a low logic level. Similarly, the switching operation of the mode switches 244 and 242 are similar to that of the mode switch 246.

Figure 1:
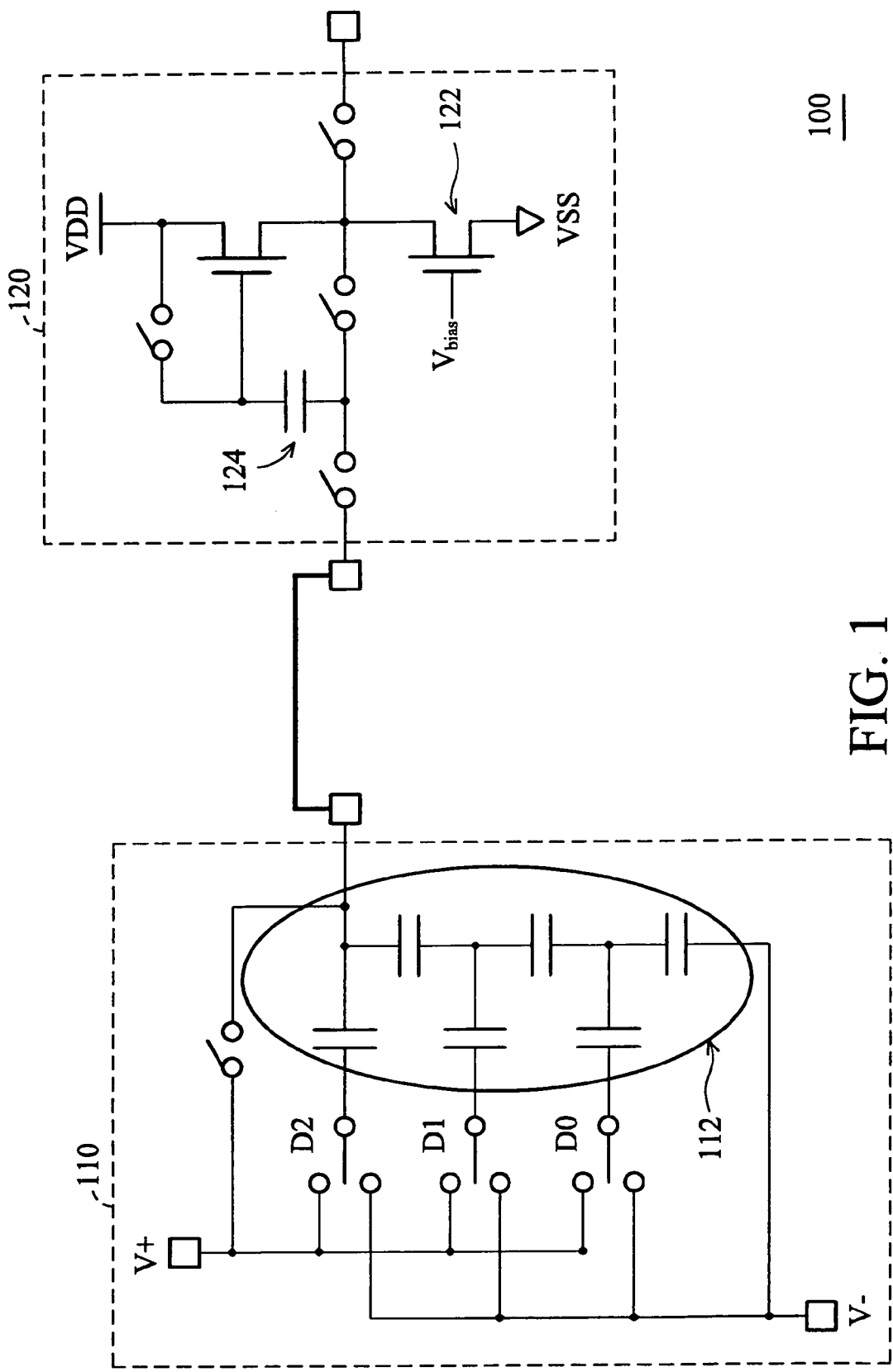
FIG. 1 shows a conventional capacitor type digital-to-analog converting circuit with an analogue buffer.
Figure 3B:
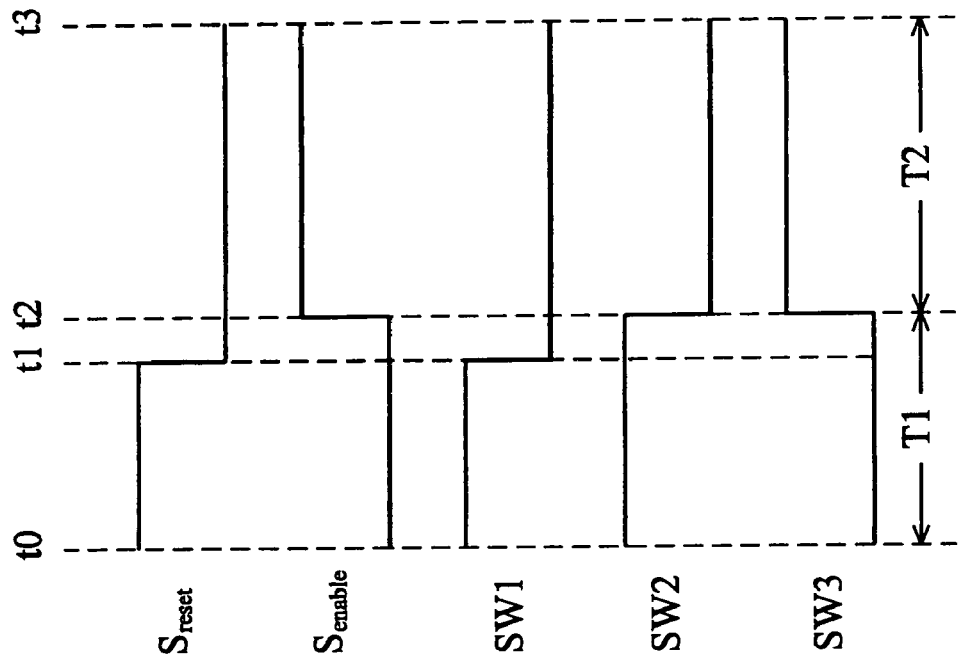
FIGS. 3A and 3B show operation timing charts of the signals and switches in FIG. 2.
Figure 3A:
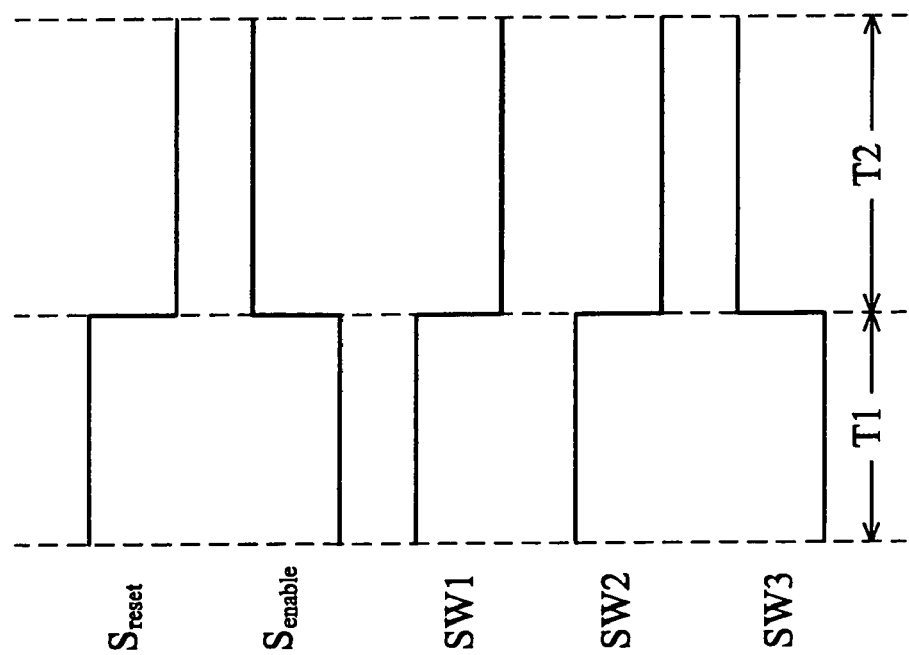

FIG. 3A shows an operation timing chart of the signals and switches in FIG. 2. As shown in FIG. 3A, during a reset period T1 of the digital-to-analog converting circuit 200, the reset signal $S_{reset}$ is at a high logic level and the enable signal $S_{enable}$ is at a low logic level. Therefore, the switches SW1 and SW2 are turned on and the switch SW3 is turned off. Note that all of the mode switches 242, 244, 246 and 240 are coupled to the node N1, as shown in FIG. 2. Hence, an equivalent capacitor of all the capacitors C1-C6 of the capacitor type digital-to-analog converter 210 functions as the storage capacitor 124 in FIG. 1. Next, during an operation period T2 of the digital-to-analog converting circuit 200, the reset signal $S_{reset}$ is changed to a low logic level and the enable signal $S_{enable}$ is changed to a high logic level. Therefore, the switches SW1 and SW2 are turned off and the switch SW3 is turned on. Simultaneously, the mode switch 240 is coupled to the reference voltage $V_{ref1}$, and the mode switches 242, 244 and 246 are coupled to the bit switches 262, 264 and 266, respectively. Furthermore, the digital-to-analog converting circuit 200 generates an analog output signal $S_{out}$ according to the bit data of the input bit signals D1, D2 and D3. FIG. 3B shows another operation timing chart of the signals and switches in FIG. 2. As shown in FIG. 3B, the reset signal $S_{reset}$ is changed from a high to low logic level at time t1, and the enable signal $S_{enable}$ is changed from a low to high logic level at time t2. Therefore, the reset signal $S_{reset}$ and the enable signal $S_{enable}$ can be operated at different times, exemplifying design flexibility for the digital-to-analog converting circuit 200.

Figure 4:
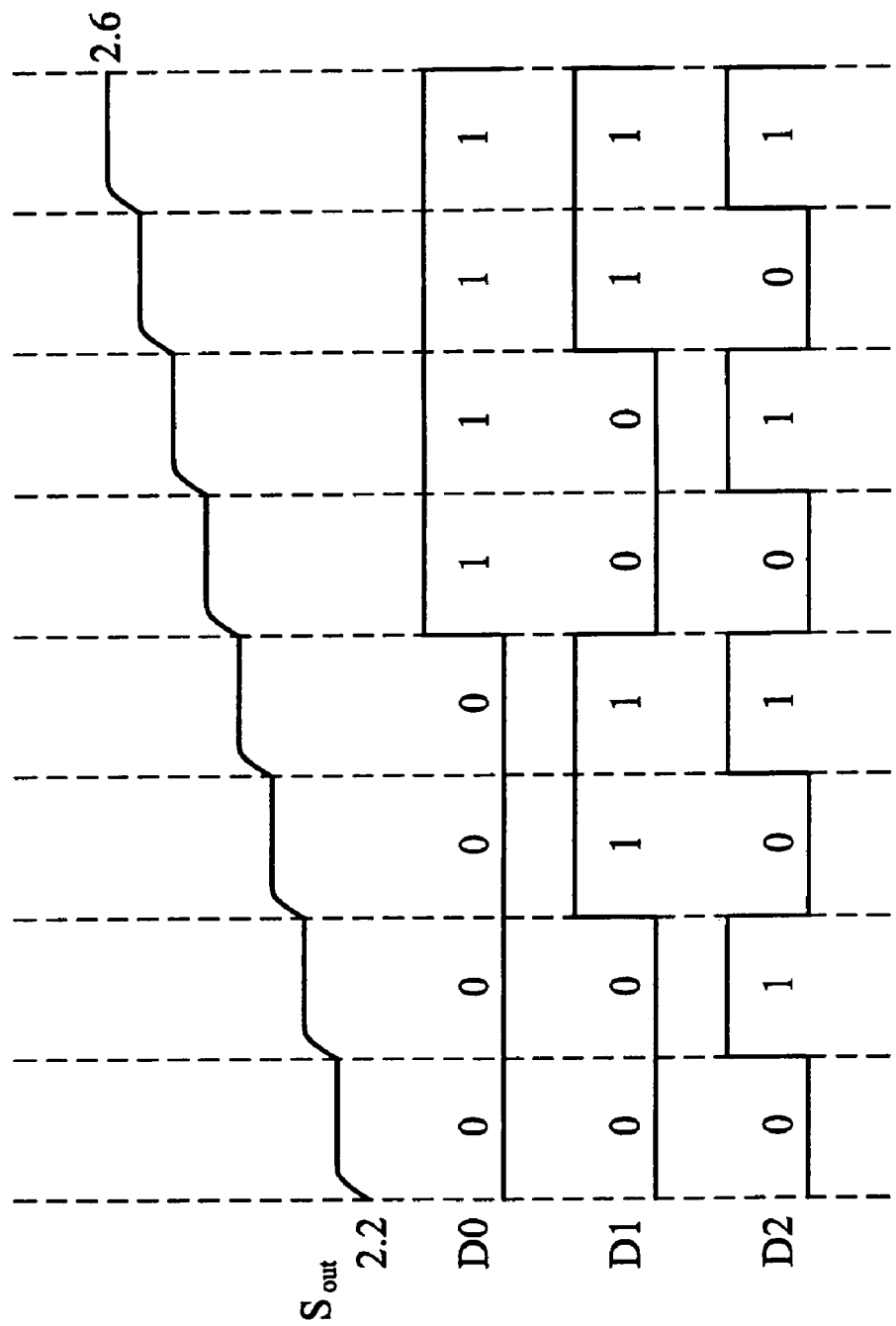
FIG. 4 shows an exemplary output waveform diagram of the 3-bit digital-to-analog converting circuit in FIG. 2.

FIG. 4 shows an exemplary output waveform diagram of the 3-bit digital-to-analog converting circuit in FIG. 2. In FIG. 4, the reference voltage $V_{ref1}$ is equal to 2.6V and the reference voltage $V_{ref2}$ is equal to 2.2V. The analog output signal $S_{out}$ generated by the 3-bit signal, which is changed from "000" to "111", is individually equal to 2.256V, 2.305V, 2.354V, 2.403V, 2.452V, 2.501V, 2.55V and 2.599V, as shown in FIG. 4.

Figure 5:
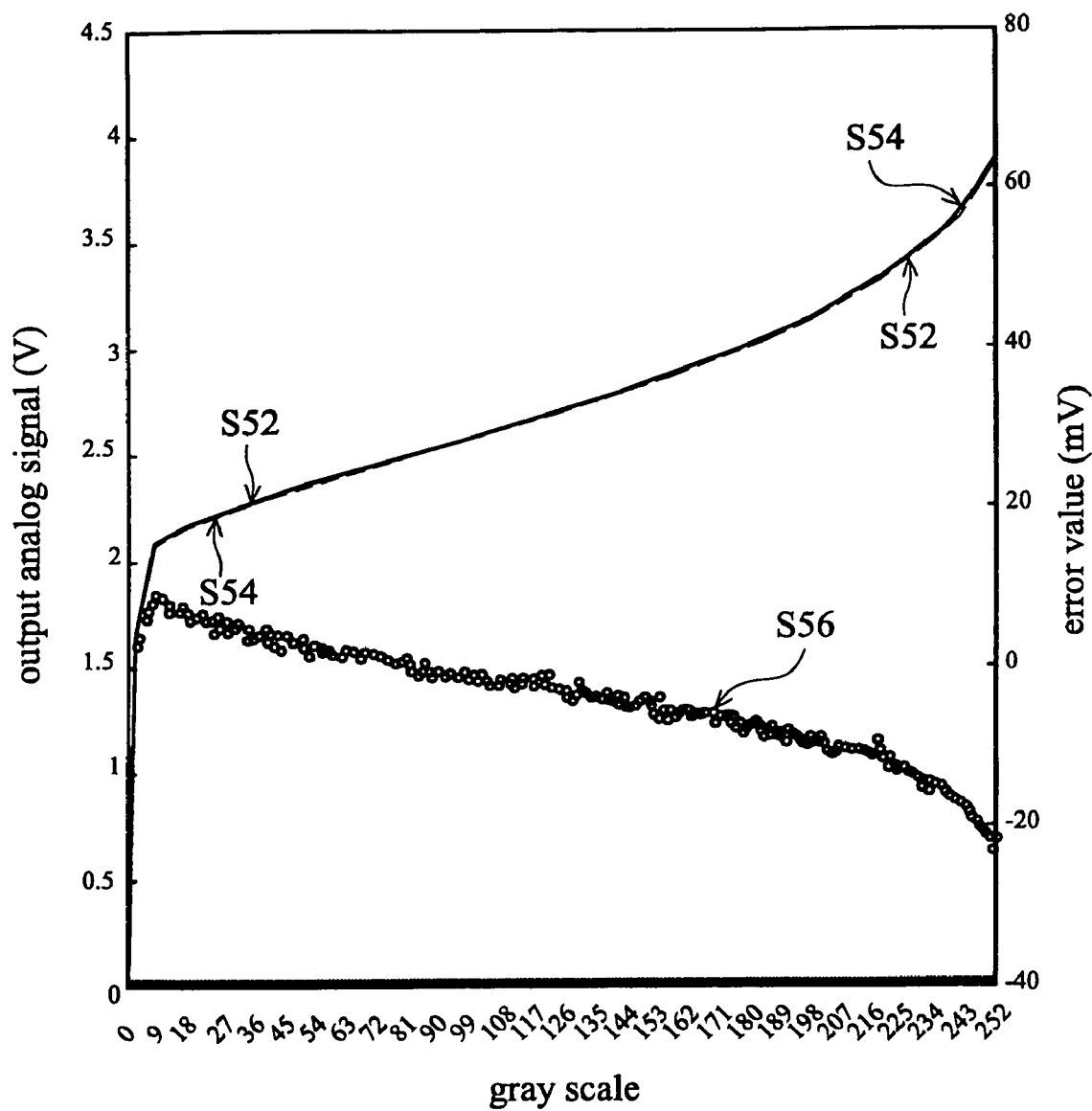
FIG. 5 shows an output curve diagram of an 8-bit digital-to-analog converting circuit according to an embodiment of the invention and an ideal 8-bit digital-to-analog converting circuit.

FIG. 5 shows an output curve diagram of an 8-bit digital-to-analog converting circuit according to an embodiment of the invention and an ideal 8-bit digital-to-analog converting circuit. The curve S52 illustrates the output voltages between different gray scales in the digital-to-analog converting circuit of the invention. The curve S54 illustrates the output voltages between different gray scales in the ideal digital-to-analog converting circuit. The curve S56 illustrates the voltage differences between the curves S52 and S54, i.e. the error voltage values of the curve S52 for the curve S54. As such, from the curve S56, it is shown that the digital-to-analog converting circuit provided by the invention has the smallest error value.

Figure 6:
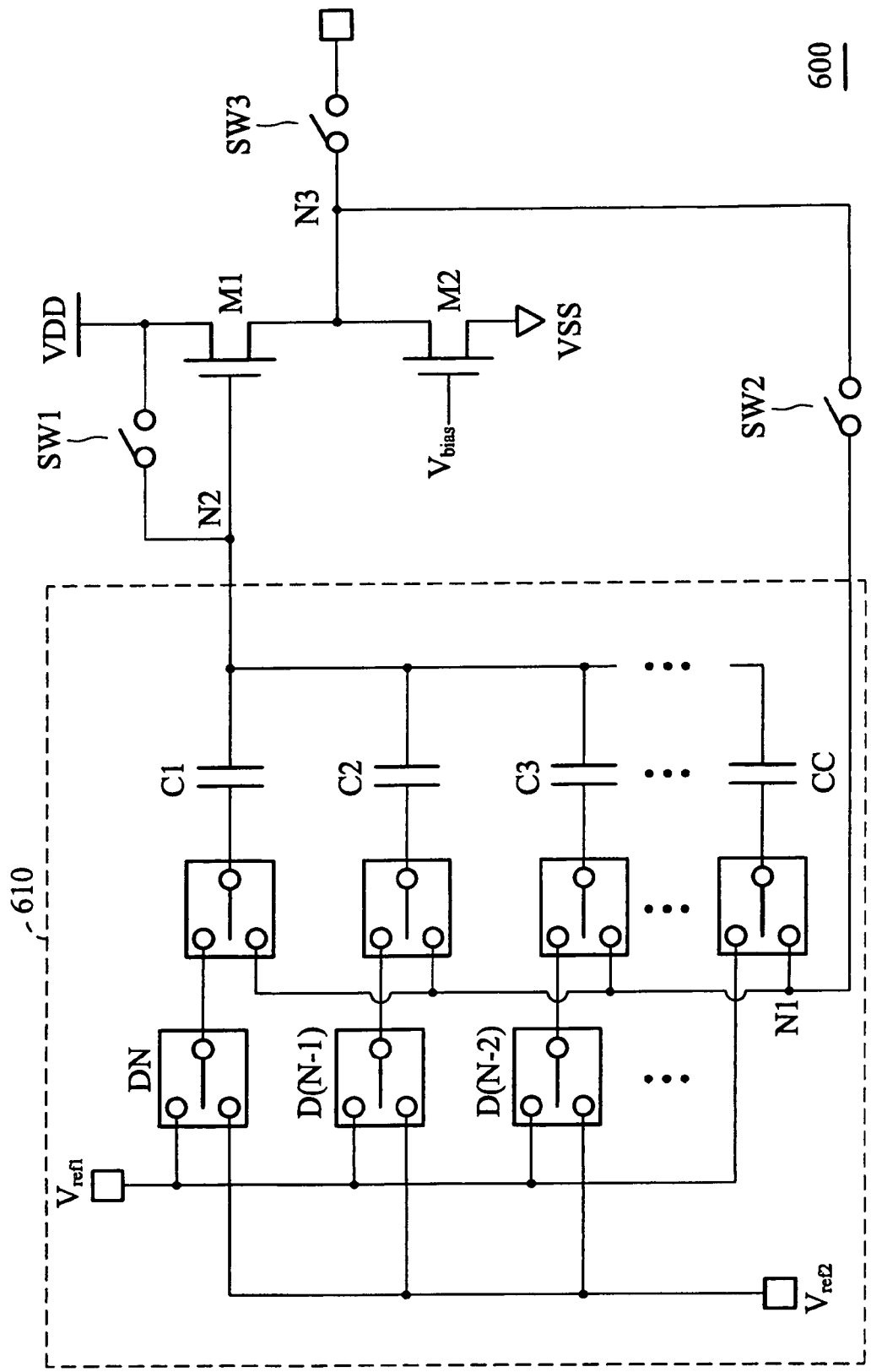
FIG. 6 shows a digital-to-analog converting circuit according to another embodiment of the invention.

The invention can apply to digital signals with any bit data. FIG. 6 shows a digital-to-analog converting circuit 600 according to another embodiment of the invention. In FIG. 6, a capacitor type digital-to-analog converter 610 is an N-bit binary-weighted digital-to-analog converter, wherein a bit signal DN is a most significant bit. The capacitances of each input circuit are increased by a power of 2 in a sequence, which corresponds to a bit sequence from a most significant bit to a least significant bit, such as $C1:C2:C3=1:2^1:2^2$. Therefore, as known in the art, a capacitance ratio of the capacitor C1 and the capacitor within the input circuit corresponding to the least significant bit is $1:2^{(N-1)}$, and a capacitance ratio of the capacitor C1 and the capacitor CC is $1:2^{(N-1)}$.

Figure 7:
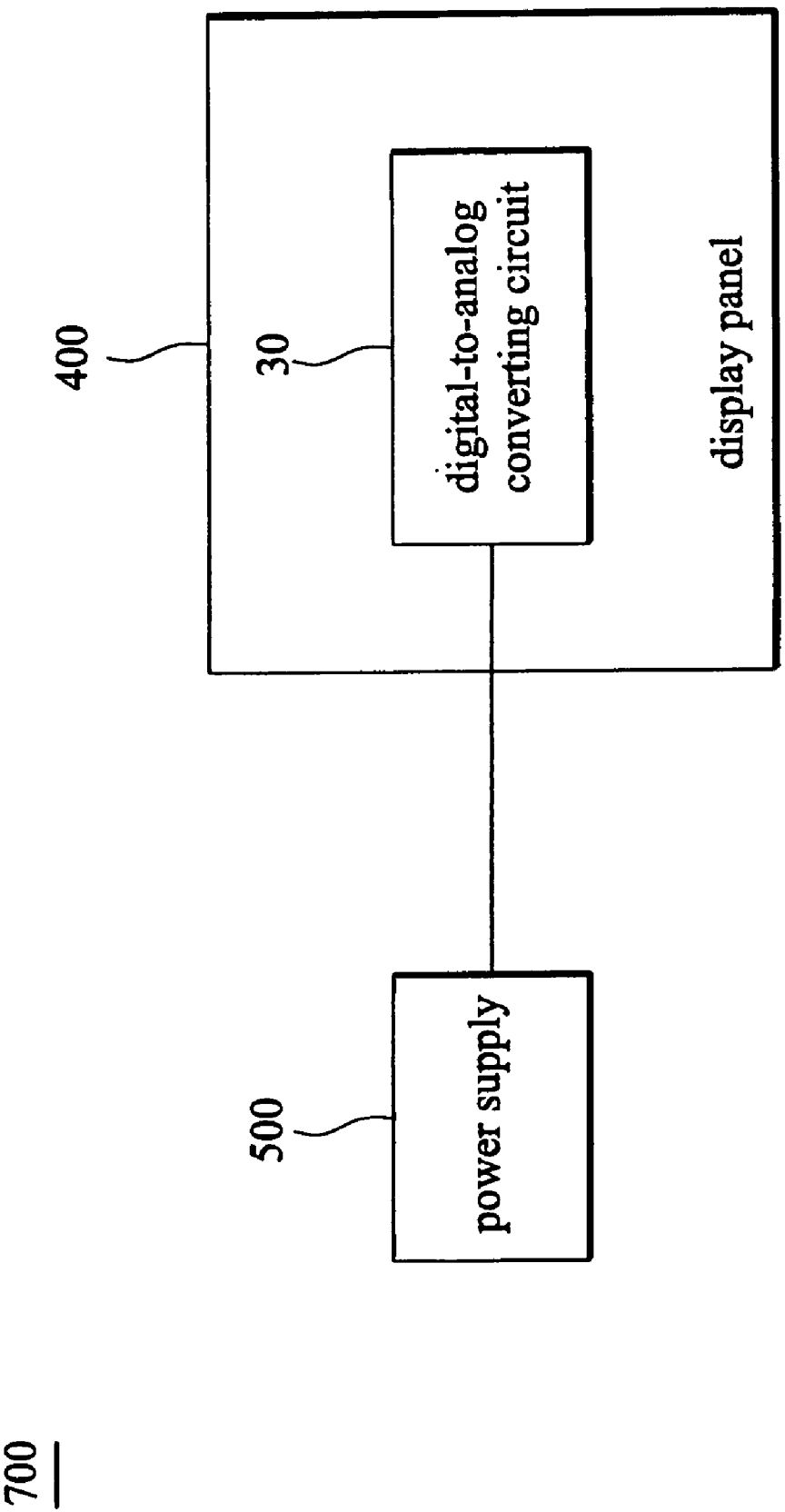
FIG. 7 shows a system for displaying images according to another embodiment of the invention.

FIG. 7 shows another embodiment of a system for displaying images, which, in this case, is implemented as a display panel 400 or an electronic device 700. As shown in FIG. 7, the display panel 400 comprises a digital-to-analog converting circuit 30, such as the digital-to-analog converting circuit 200 shown in FIG. 2 or 600 shown in FIG. 6. The display panel 400 can form a portion of a variety of electronic devices (in this case, the electronic device 700). Generally, the electronic device 700 can comprise the display panel 400 and a power supply 500. Further, the power supply 500 is operatively coupled to the display panel 400 and provides electric energy/power to the display panel 400. The electronic device 700 can be a mobile phone, digital camera, personal data assistant (PDA), notebook computer, desktop computer, television, car display, aerial display, global positioning system (GPS), digital photo frame or portable DVD player, for example.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A system for displaying images, comprising:
   a digital-to-analog converting circuit for converting a digital signal with N bit data to an analog output signal, comprising:
   a capacitor type digital-to-analog converter coupled between a first node and a second node, comprising a plurality of capacitors and switches and generating a first analog signal according to the digital signal, a first reference voltage and a second reference voltage;
   an analogue buffer coupled between the second node and a third node for generating a second analog signal according to the first analog signal and a bias voltage, comprising:
     a first transistor coupled between a predetermined voltage and the third node, having a first gate coupled to the second node; and
     a second transistor coupled between a ground and the third node, having a second gate coupled to the bias voltage;
   a first switch coupled between the predetermined voltage and the second node;
   a second switch coupled between the first node and the third node; and
   a third switch coupled between the third node and the analog output signal for transmitting the second analog signal as the analog output signal when the third switch is turned on,
   wherein the second switch is turned on and the third switch is turned off when the first switch is turned on, and the first and second switches are turned off when the third switch is turned on.

2. The system as claimed in claim 1, wherein the capacitor type digital-to-analog converter further comprises:
   a capacitor switch network, comprising N input circuits corresponding to each bit data of the input signal respectively, wherein each input circuit comprises:
     a bit switch, which is selectively coupled to one of the first and second reference voltages according to the corresponding bit data;
     a first mode switch, which is selectively coupled to one of the bit switch and the first node according to a reset signal; and
     a first capacitor coupled between the first mode switch and the second node;
   a second mode switch, which is selectively coupled to one of the first reference voltage and the first node according to the reset signal; and
   a second capacitor coupled between the second mode switch and the second node.

3. The system as claimed in claim 2, wherein the first switch is turned on when the reset signal is at a first logic level.

4. The system as claimed in claim 3, wherein the first and second mode switches are coupled to the first node when the reset signal is at the first logic level.

5. The system as claimed in claim 3, wherein the first switch is turned off when the reset signal is at a second logic level.

6. The system as claimed in claim 5, wherein the first mode switch is coupled to the bit switch and the second mode switch is coupled to the first reference voltage when the reset signal is at the second logic level.

7. The system as claimed in claim 2, the bit switch is coupled to the first reference voltage when the bit data is at a high logic level, and the bit switch is coupled to the second reference voltage when the bit data is at a low logic level.

8. The system as claimed in claim 7, wherein the first reference voltage is greater than the second reference voltage.

9. The system as claimed in claim 2, wherein the capacitor switch network further comprises (N−1) third capacitors coupled between the two adjacent input circuits, respectively.

10. The system as claimed in claim 9, wherein a capacitance ratio of the first capacitor to the second capacitor is 1:1, and a capacitance ratio of the first capacitor to the third capacitor is 1:2.

11. The system as claimed in claim 10, wherein the capacitor type digital-to-analog converter is a C-2C ladder digital-to-analog converter.

12. The system as claimed in claim 1, wherein the capacitances of the first capacitors are increased by a power of 2 in a sequence, which corresponds to a bit sequence from a most significant bit (MSB) to a least significant bit (LSB) of the digital signal.

13. The system as claimed in claim 12, wherein a capacitance ratio of the first capacitor to the second capacitor is $1:2^{(N-1)}$.

14. The system as claimed in claim 13, wherein the capacitor type digital-to-analog converter is a binary-weighted digital-to-analog converter.

15. The system as claimed in claim 1, further comprising a display panel, wherein the digital-to-analog converting circuit forms a portion of the display panel.

16. The system as claimed in claim 1, further comprising an electronic device, wherein the electronic device comprises:
   a display panel; and
   a power supply coupled to the display panel and operative to provide power to the display panel.

17. The system as claimed in claim 16, wherein the electronic device is a mobile phone, digital camera, personal data assistant (PDA), notebook computer, desktop computer, television, car display, aerial display, global positioning system (GPS), digital photo frame or portable DVD player.

* * * * *